(12) United States Patent
Park et al.

(10) Patent No.: US 7,309,885 B2
(45) Date of Patent: Dec. 18, 2007

(54) PRAMS HAVING A PLURALITY OF ACTIVE REGIONS LOCATED VERTICALLY IN SEQUENCE AND METHODS OF FORMING THE SAME

(75) Inventors: Jae-Hyun Park, Yongin-si (KR); Hyeong-Geun An, Suwon-si (KR); Su-Jin Ahn, Seoul (KR); Yoon-Jong Song, Seoul (KR); Hyung-Joo Youn, Suwon-si (KR); Kyu-Chul Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 20 days.

(21) Appl. No.: 11/246,863

(22) Filed: Oct. 7, 2005

(65) Prior Publication Data

US 2006/0076548 A1 Apr. 13, 2006

(30) Foreign Application Priority Data

Oct. 8, 2004 (KR) ...................... 10-2004-0080546

(51) Int. Cl.
*H01L 27/10* (2006.01)
(52) U.S. Cl. ...................... 257/211; 257/209; 257/326; 257/758; 257/E21.021; 257/E21.421
(58) Field of Classification Search .................... None
See application file for complete search history.

(56) References Cited

U.S. PATENT DOCUMENTS 5,998,873 A * 12/1999 Blair et al. .................. 257/766

| 6,429,484 | B1 * | 8/2002 | Yu | 257/347 |
| 6,740,921 | B2 | 5/2004 | Matsuoka et al. | 257/302 |
| 7,038,261 | B2 * | 5/2006 | Horii | 257/295 |

FOREIGN PATENT DOCUMENTS

| JP | 2003-092390 | 3/2003 |
| KR | 2002-0076460 | 10/2002 |

* cited by examiner

*Primary Examiner*—Sue A. Purvis
*Assistant Examiner*—Scott R. Wilson
(74) *Attorney, Agent, or Firm*—Mills & Onello LLP

(57) ABSTRACT

There are provided PRAMS having a plurality of active regions located vertically in sequence and methods of forming the same. The PRAM and the method provide an approach to rapidly changing phase in a phase change layer pattern with a given design rule. A semiconductor substrate defining at least one reference active region is prepared in a cell array region and a peripheral circuit region. Other semiconductor substrates on a vertical line passing a main surface of the reference active region are located in sequence. The other semiconductor substrates define other active regions, respectively. A lower cell gate pattern is formed on the semiconductor substrate of the reference active region, and upper cell gate patterns are disposed on the other semiconductor substrates of the other active regions, respectively.

14 Claims, 17 Drawing Sheets

PRAMS HAVING A PLURALITY OF ACTIVE REGIONS LOCATED VERTICALLY IN SEQUENCE AND METHODS OF FORMING THE SAME

REFERENCE TO PRIORITY APPLICATION

This application claims priority to Korean Application Serial No. 2004-80546, filed Oct. 8, 2004, the contents of which are hereby incorporated herein by reference.

FIELD OF THE INVENTION

The invention relates to phase-change random access memories (PRAMs) and methods of forming the same, and more particularly, to PRAMs having a plurality of active regions located vertically in sequence and methods of forming the same.

BACKGROUND OF THE INVENTION

Generally, a PRAM has a cell array region and a peripheral circuit region in which semiconductor discrete devices are arranged. The cell array region has gate patterns on a main surface of a semiconductor substrate and phase change layer patterns above the gate patterns. The cell array region has a plug for electrically connecting a gate pattern and a phase change layer pattern in one cell. In the PRAM, a change of phase of the crystal structure of the phase change layer pattern is initiated using current flowing through the gate pattern and the plug. The phase change of the crystal structure of the phase change layer pattern can change data of the cell of the PRAM. The peripheral circuit region has other gate patterns on the main surface of the semiconductor substrate, but does not have phase change layer patterns above the other gate patterns. Also, the other gate pattern is located adjacent to the cell array region and transmits the data of the cell of the cell array region.

However, the PRAM typically does not have a gate pattern having high design pattern fidelity on the semiconductor substrate due to gradual reduction of a given design rule. This is because a photolithography process has a limit in defining a pattern image on a photoresist layer corresponding to the reduced design rule. In addition, the gate pattern in the cell array region has a poor current driving capability compared to that prior to the reduced design rule, such that there is difficulty in rapidly changing the phase of the phase change layer pattern. Accordingly, the plug between the phase change layer pattern and the gate pattern needs to be formed in a material capable of minimizing current loss.

U.S. Pat. No. 6,429,484 to Bin Yu (the '484 patent) discloses a multiple active layer structure and a method of making such a structure. According to the '484 patent, the structure and the method include a first layer having an oxide layer, a first active semiconductor layer, and a first insulating layer stacked in sequence. A second active layer is formed on the first insulating layer and is recrystallized by using a first seed window in the first insulating layer. Further, a second insulating layer is formed on the second active layer.

The structure and the forming method further include a third active layer on the second insulating layer. The third active layer is recrystallized by using a second seed window. The second seed window aligns the first seed window. At least one transistor is located on at least a portion of the first active layer. At least other transistor is formed on at least a portion of the second active layer. Further, at least still other transistor is formed on at least a portion of the third active layer.

However, in the structure and the forming method, if the thicknesses of the first and second insulating layers are too small, source or drain regions of the transistors on the first through third active layers may contact each other. As a result, the respective transistor has source and drain regions having different resistance values. Accordingly, the transistors may exhibit undesired performance characteristics.

SUMMARY OF THE INVENTION

According to some embodiments of the invention, the invention provides a PRAM having a plurality of active regions located vertically in sequence, by which integration of cell and peripheral transistors increases in a cell array region and a peripheral circuit region.

The invention also provides a method of forming a PRAM having a plurality of active regions located vertically in sequence, by which integration of cell and peripheral transistors increases in a cell array region and a peripheral circuit region to exhibit good design performance.

According to the invention, there is provided PRAMs having a plurality of active regions located vertically in sequence and methods of forming the same.

According to one aspect of the invention, there is provided a phase change random access memory (PRAM) having a phase change layer pattern in a cell array region. A first semiconductor substrate defines at least one reference active region. At least one other semiconductor substrate is located in sequence on a vertical line passing a main surface of the reference active region. The other semiconductor substrates define other active regions, respectively. The other semiconductor substrates are in parallel with the semiconductor substrate. A lower cell gate pattern is located on the semiconductor substrate of the reference active region and upper cell gate patterns are located on the other semiconductor substrates of the other active regions, respectively. Metal node plugs are located at both sides of the lower and upper cell gate patterns and are in contact with the semiconductor substrate penetrating the other semiconductor substrates. One of the metal node plugs is located below the phase change layer pattern and is electrically connected to the phase change layer pattern.

According to another aspect, the invention is directed to a phase change random access memory (PRAM) having a circuit wire in a peripheral circuit region. A semiconductor substrate defines at least one reference active region. One or more other semiconductor substrates are located in sequence on a vertical line passing a main surface of the reference active region. The other semiconductor substrates define the other active regions, respectively, and the other semiconductor substrates are in parallel with the semiconductor substrate. A lower peripheral gate pattern is located on the semiconductor substrate of the reference active region and upper peripheral gate patterns are located on the other semiconductor substrates of the other active regions, respectively. Metal node plugs are located at both sides of the lower and upper peripheral gate patterns and are in contact with the semiconductor substrate penetrating the other semiconductor substrates. One of the metal node plugs is located below the circuit wire and is electrically connected to the circuit wire.

According to another aspect, the invention is directed to a method of forming a phase change random access memory (PRAM) having a phase change layer pattern in a cell array region. According to the method, a lower cell gate pattern is formed on a semiconductor substrate of at least one reference active region. A pad interlayer insulating layer is formed on the semiconductor substrate to cover the lower cell gate pattern. Upper cell gate patterns are formed on at least one other semiconductor substrate of at least one other active region, which are formed vertically in sequence from the upper surface of the pad interlayer insulating layer above the reference active region. Pad interlayer insulating layers are formed on the other semiconductor substrates to cover the upper cell gate patterns, respectively. Metal node plugs are formed at both sides of the lower and upper cell gate patterns to be in contact with the semiconductor substrate penetrating the pad interlayer insulating layers and the other semiconductor substrates. The other active regions are formed in parallel with the reference active region, and the phase change layer pattern is formed above the metal node plugs and is electrically connected to one of the metal node plugs.

According to another aspect, the invention is directed to a method of forming a phase change random access memory (PRAM) having a circuit wire in a peripheral array region. According to the method, a lower peripheral gate pattern is formed on a semiconductor substrate of at least one reference active region. A pad interlayer insulating layer is formed on the semiconductor substrate to cover the lower peripheral gate pattern. Upper peripheral gate patterns are formed on at least one other semiconductor substrate of at least one other active region, which are formed vertically in sequence from the upper surface of the pad interlayer insulating layer above the reference active region. Pad interlayer insulating layers are formed on the other semiconductor substrates to cover the upper peripheral gate patterns, respectively. Metal node plugs are formed at both sides of the lower and upper peripheral gate patterns to be in contact with the semiconductor substrate penetrating the pad interlayer insulating layers and the other semiconductor substrates. The other active regions are formed in parallel with the reference active region, and the circuit wire is formed above the metal node plugs and is electrically connected to one of the metal node plugs.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being located upon illustrating the principles of the invention. In the drawings, the thickness of layers and regions are exaggerated for clarity.

DETAILED DESCRIPTION OF PREFERRED EMBODIMENTS

The present invention will now be described more fully hereinafter with reference to the accompanying drawings, in which preferred embodiments of the invention are shown. It will be understood that when a layer is referred to as being "on" other layer or substrate, it can be directly on the other layer or substrate, or intervening layers may also be present. Like numbers refer to like elements throughout.

Figure 1:
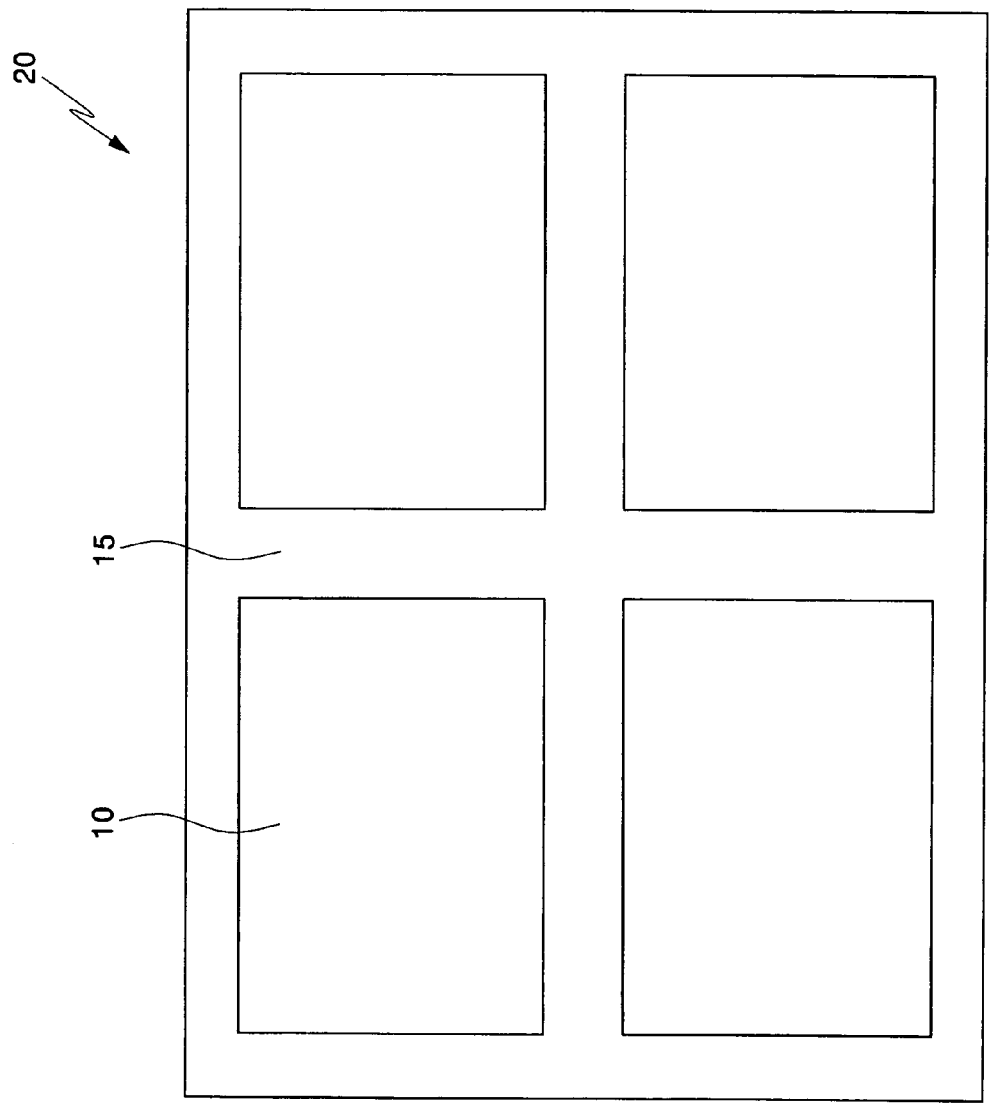
FIG. 1 is a layout view of a PRAM according to the invention.
Figure 2:
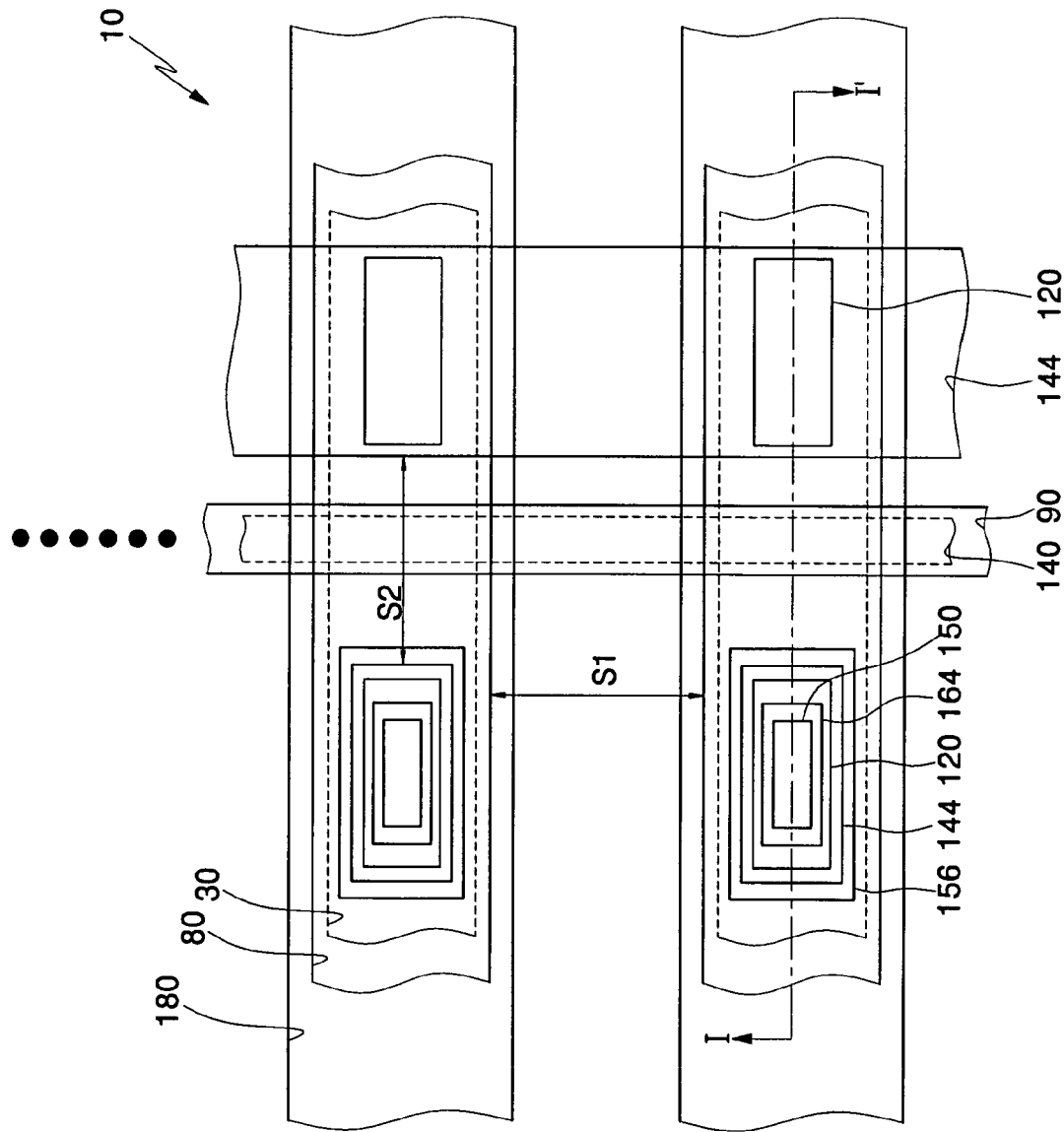
FIGS. 2 and 3 are layout views of active regions of a cell array region and a peripheral circuit region of FIG. 1, respectively.
Figure 3:
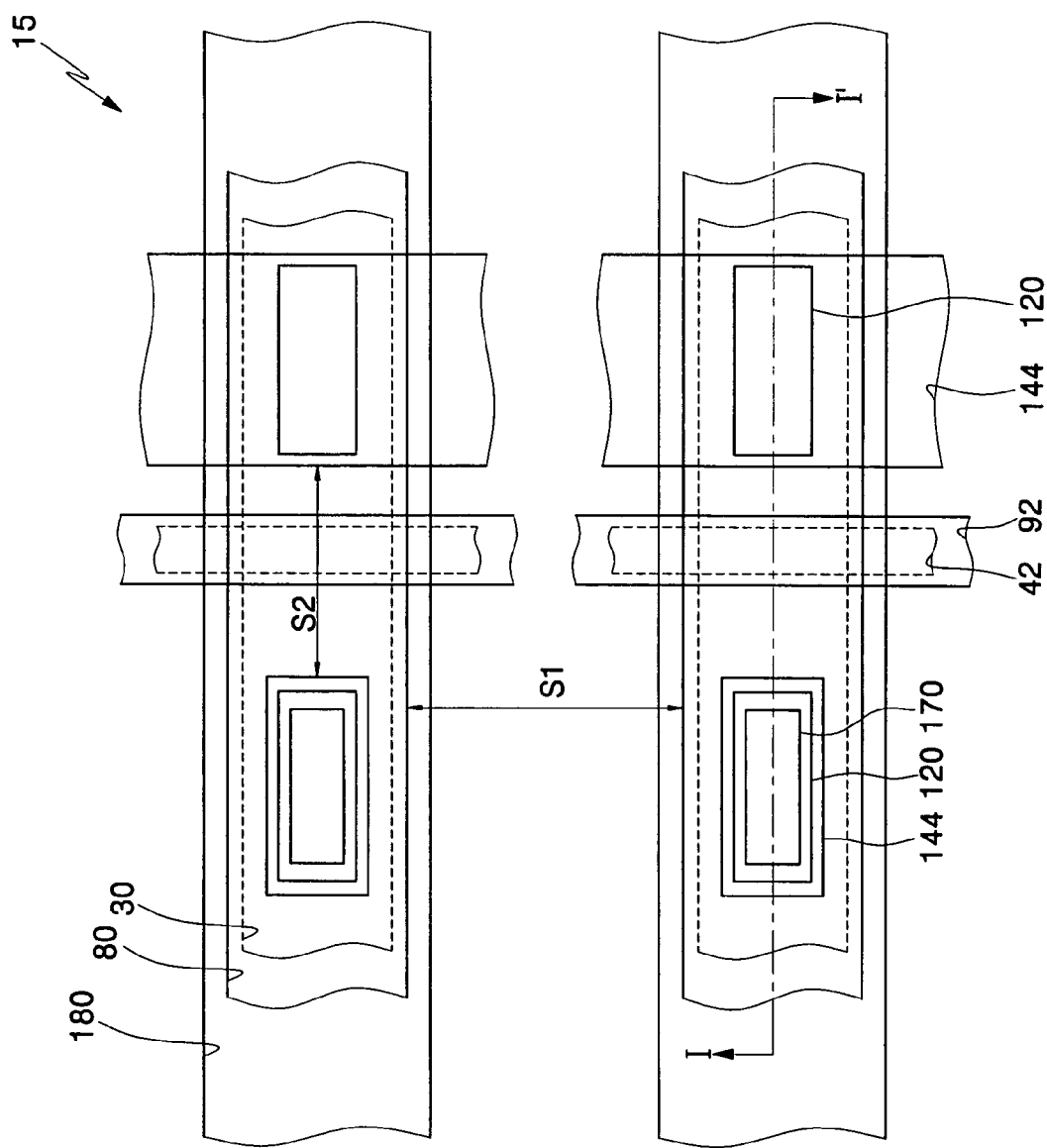
Figure 4:
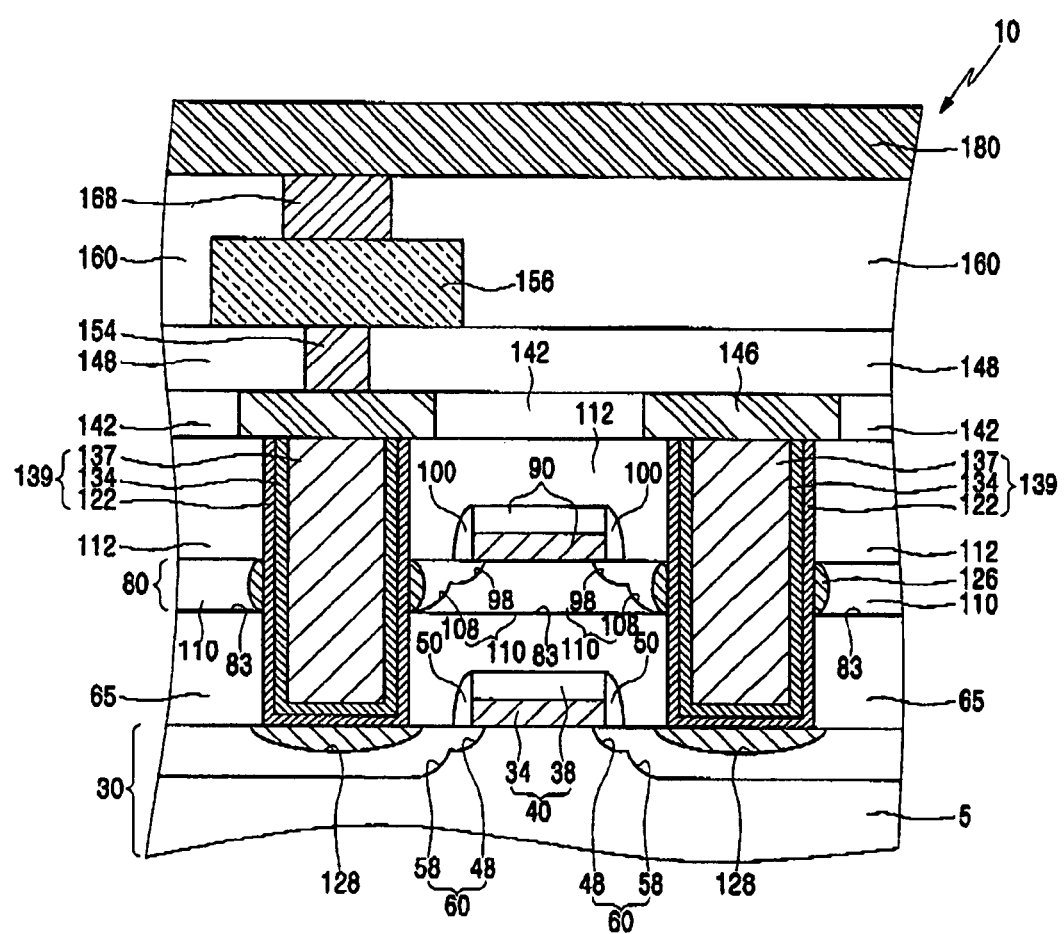
FIGS. 4 and 5 are cross-sectional views of the PRAM taken along lines I-I' of FIGS. 2 and 3, respectively.
Figure 5:
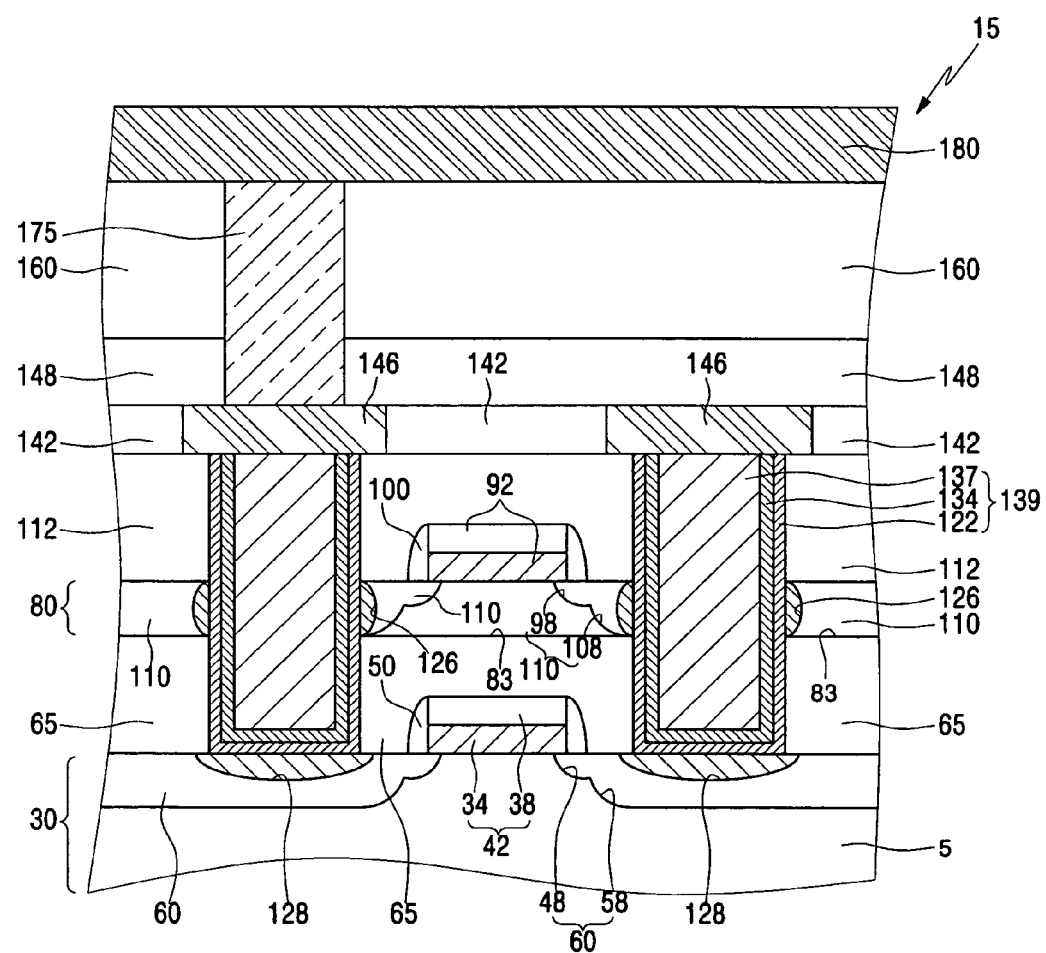

FIG. 1 is a layout view of a PRAM according to the invention, and FIGS. 2 and 3 are layout views of active regions of a cell array region and a peripheral circuit region of FIG. 1, respectively. Further, FIGS. 4 and 5 are cross-sectional views of the PRAM taken along by lines I-I' of FIGS. 2 and 3, respectively.

Referring to FIGS. 1 to 5, a PRAM 20 includes a cell array region 10 and a peripheral circuit region 15 as shown in FIG. 1. The cell array region 10 stores data through a phase change layer pattern 156 as showin in FIG. 4. The peripheral circuit region 15 has a circuit wire 180 for transmitting the data of the phase change layer pattern 156 of the cell array region. The phase change layer pattern 156 preferably comprises Chalcogenide containing a combination ($Ge_xSb_yTe_z$) of germanium, antimony, and tellurium. At least one reference active region 30 is located in each of the cell array region 10 and the peripheral circuit region 15. The reference active region 30 may be defined in a predetermined region of a semiconductor substrate 5. The semiconductor substrate 5 comprises single crystal silicon. The semiconductor substrate 5 preferably has P-type conductivity.

Other semiconductor substrate 83 is located in each of the cell array region 10 and the peripheral circuit region 15 in parallel with the semiconductor substrate 5. The other semiconductor substrate 83 is located on a vertical line passing a main surface of the reference active region 30 and defines other active region 80. Alternatively, a plurality of other semiconductor substrates 83 may be stacked in sequence in parallel with the semiconductor substrate 5. It is preferable that the semiconductor substrates 83 be located on a vertical line passing a main surface of a reference active region 30 and defines other active regions 80. It is preferable that each of the other active regions 80 have the same width as that of the reference active region 30. Each of the other active regions 80 may have a width different from the reference active region 30. It is preferable that the other semiconductor substrate 83 comprise crystal silicon.

A lower cell gate pattern 40 is located on the semiconductor substrate 5 of the reference active region 30 in the cell array region 10. A lower peripheral gate pattern 42 is located on the semiconductor substrate 5 of the reference active region 30 in the peripheral circuit region 15. Each of the lower cell and peripheral gate patterns 40 and 42 has a gate 34 and a gate capping layer pattern 38 stacked thereon. It is preferable that the gate 34 include an $N^+$-type polysilicon layer and a metal silicide layer stacked thereon. The gate 34 may include only an $N^+$-type polysilicon layer. It is preferable that the gate capping layer pattern 38 comprise silicon nitride ($Si_3N_4$). The lower gate spacers 50 are located on sidewalls of the lower cell and peripheral gate patterns 40 and 42, respectively. It is preferable that the lower gate spacers 50 comprise an insulating layer having the same etching rate as the gate capping layer pattern 38.

An upper cell gate pattern 90 is located on the other semiconductor substrate 83 of the other active region 80 in the cell array region 10. Upper cell gate patterns 90 may be located on the other semiconductor substrates 83 of the other active regions 80 in the cell array region 10, respectively. Further, an upper peripheral gate pattern 92 is located on the other semiconductor substrate 83 of the other active region 80 in the peripheral circuit region 15. Upper peripheral gate patterns 92 may be located on the other semiconductor substrates 83 of the other active regions 80 in the peripheral circuit region 15, respectively. It is preferable that the upper cell and peripheral gate patterns 90 and 92 have the same structure as the lower cell and peripheral gate patterns 40 and 42. Upper gate spacers 100 are located on sidewalls of the upper cell and peripheral gate patterns 90 and 92, respectively.

Pad interlayer insulating layers 65 and 112 are located on the semiconductor substrate 5 and the other semiconductor substrate 83 to cover the lower and upper cell gate patterns 40 and 90 in the cell array region 10, respectively. Pad interlayer insulating layers 65 and 112 may be located on the semiconductor substrate 5 and the other semiconductor substrates 83 to cover the lower and upper cell gate patterns 40 and 90, respectively. Further, pad interlayer insulating layers 65 and 112 are located on the semiconductor substrate 5 and the other semiconductor substrate 83 to cover the lower and upper peripheral gate patterns 42 and 92 in the peripheral circuit region 15, respectively. Pad interlayer insulating layers 65 and 112 may be located on the semiconductor substrate 5 and the other semiconductor substrates 83 to cover the lower and upper peripheral gate patterns 42 and 92 in the peripheral circuit region 15, respectively. It is preferable that the pad interlayer insulating layers 65 and 112 comprise an insulating layer having an etching rate different from that of the lower and upper gate spacers 50 and 100, respectively. It is preferable that one 112 of the pad interlayer insulating layers 65 and 112 fill a predetermined spacing S1 between the other active regions 80 in the cell array region 10 as shown in FIG. 2 and a predetermined spacing S1 between the other active regions 80 in the peripheral circuit region 15 as shown in FIG. 3.

Impurity regions 60 and 110 are located on the semiconductor substrate 5 and the other semiconductor substrate 83 to overlap the lower and upper cell gate patterns 40 and 90 in the cell array region 10 and the lower and upper peripheral gate patterns 42 and 92 in the peripheral circuit region 15, respectively. Alternatively, impurity regions 60 and 110 may be located on the semiconductor substrate 5 and the other semiconductor substrates 83 to overlap the lower and upper cell gate patterns 40 and 90 in the cell array region 10 and the lower and upper peripheral gate patterns 42 and 92 in the peripheral circuit region 15, respectively. The impurity regions 60 comprise N$^-$-type and N$^+$-type conductive regions 48 and 58 in the cell array region 10 and in the peripheral circuit region 15. The impurity regions 110 comprise N$^-$-type and N$^+$-type conductive regions 98 and 108 in the cell array region 10 and the peripheral circuit region 15. It is preferable that the impurity regions 60 and 110 have the same conductivity type. The impurity regions 60 may have a conductivity type different from the impurity regions 110. It is preferable that the impurity regions 60 have the same conductivity type as the semiconductor substrate 5. The impurity regions 60 may have a conductivity type different from that of the semiconductor substrate 5.

Metal node plugs 139 are located at both sides of the lower and upper cell gate patterns 40 and 90 in the cell array region 10 and the lower and upper peripheral gate patterns 42 and 92 in the peripheral circuit region 15. The metal node plugs 139 are in contact with the semiconductor substrate 5 penetrating the other semiconductor substrate 83. The metal node plugs 139 may be in contact with the semiconductor substrate 5 penetrating the other semiconductor substrates 83 in sequence. The metal node plugs 139 allow resistances of the impurity regions 60 and 110 which overlap the lower and upper cell gate patterns 40 and 90 in the cell array region 10 to be equal to each other, unlike the prior art. In addition, the metal node plugs 139 allow resistances of the impurity regions 60 and 110 which overlap the lower and upper peripheral gate patterns 42 and 92 in the peripheral circuit region 15 to be equal to each other. This is because the metal node plugs 139 have a deterrent against contacting the impurity regions 60 and 110 through the semiconductor substrate 5 and the other semiconductor substrates 83. The impurity regions 60 and 110 may be referred to as source and drain regions of transistors.

One of the metal node plugs 139 in the cell array region 10 is located below the phase change layer pattern 156 and is electrically connected to the phase change layer pattern 156. Also, one of the metal node plugs 139 in the peripheral array region 15 is located below the circuit wire 180 and is electrically connected to the circuit wire 180. It is preferable that the metal node plug 139 include a cobalt (Co) layer 122, a barrier layer 134, and a tungsten (W) layer 137 stacked in sequence. It is preferable that the barrier layer 134 comprise titanium (Ti) and titanium nitride (TiN) stacked thereon.

The semiconductor substrate 5 and the other semiconductor substrate 83 in the cell array region 10 and the peripheral circuit region 15 have cobalt silicide layers 126 and 128 at portions that are in contact with the metal node plugs 139, respectively. Also, the semiconductor substrate 5 and the other semiconductor substrates 83 in the cell array region 10 and the peripheral circuit region 15 have cobalt silicide layers 126 and 128 at portions that are in contact with the metal node plugs 139, respectively. It is preferable that the metal node plugs 139 be in contact with the impurity regions 60 and 110 in the cell array region 10 and the peripheral circuit region 15, respectively.

Buried plugs 146 and a node plug 154 contacting one of the buried plugs 146 are located between the metal node plugs 139 and the phase change layer pattern 156 in the cell array region 10. A buried interlayer insulating layer 142 and a planarization interlayer insulating layer 148 surround the buried plugs 146 and the node plug 154, respectively. The node plug 154 is in contact with the phase change layer pattern 156. It is preferable that the buried plugs 146 include a landing pad and a lower wire. The landing pad is located under the node plug 154 and is in contact with one of the metal node plugs 139. The lower wire is in contact with the remaining metal node plug 139. A contact plug 168 and the circuit wire 180 are stacked in sequence on the phase change layer pattern 156. The phase change layer pattern 156 and the contact plug 168 are surrounded by a protective interlayer insulating layer 160. The circuit wire 180 is referred to as an upper wire corresponding to the lower wire.

Buried plugs 146 and a landing plug 175 contacting with one of the buried plugs 146 are located between the metal node plugs 139 and the circuit wire 180 in the peripheral circuit region 15. A buried interlayer insulating layer 142 surrounds the buried plugs 146, and a planarization interlayer insulating layer 148 and a protective interlayer insulating layer 160 surround the landing plug 175. The landing plug 175 is in contact with the circuit wire 180. It is preferable that the buried plugs 146 include a landing pad and a lower wire. The landing pad is located under the landing plug 175 and is in contact with one of the metal node plugs 139. The lower wire is in contact with the remaining metal node plug 139. It is preferable that the buried interlayer insulating layer 142 fill a predetermined spacing S2 between the buried plugs 146, which fill buried contact holes 144 respectively in the cell array region 10 and the peripheral circuit region 15 as shown in FIGS. 2 and 3.

A method of forming a PRAM having a plurality of active regions located vertically in sequence according to an embodiment of the invention will be described in more detail.

FIGS. 6 to 18 are cross-sectional views illustrating a method of forming a PRAM taken along by lines I-I' of FIGS. 2 and 3.

Figure 6:
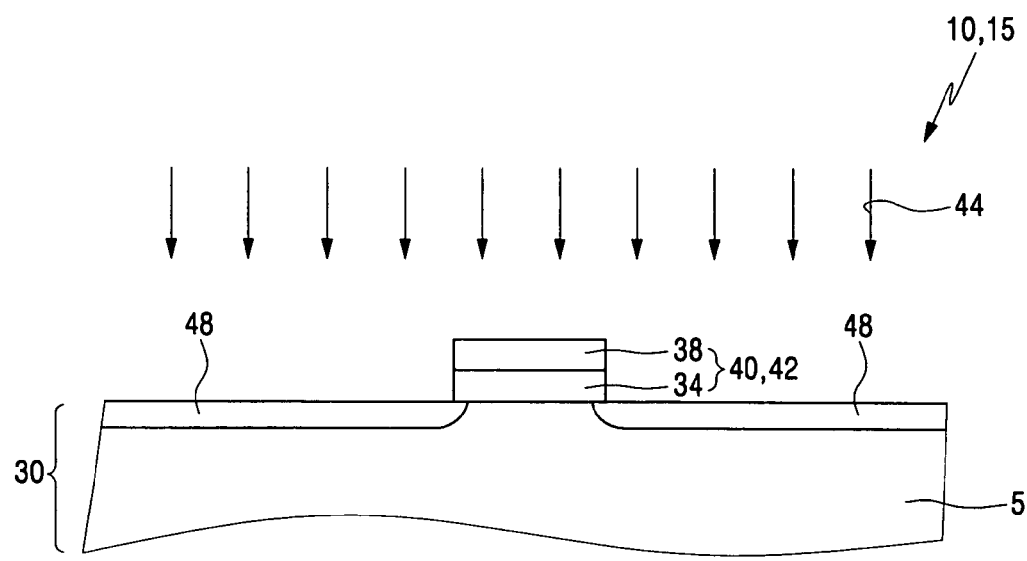
FIGS. 6 to 18 are cross-sectional views taken along lines I-I' of FIGS. 2 and 3, illustrating a method of forming a PRAM in accordance with the invention.
Figure 7:
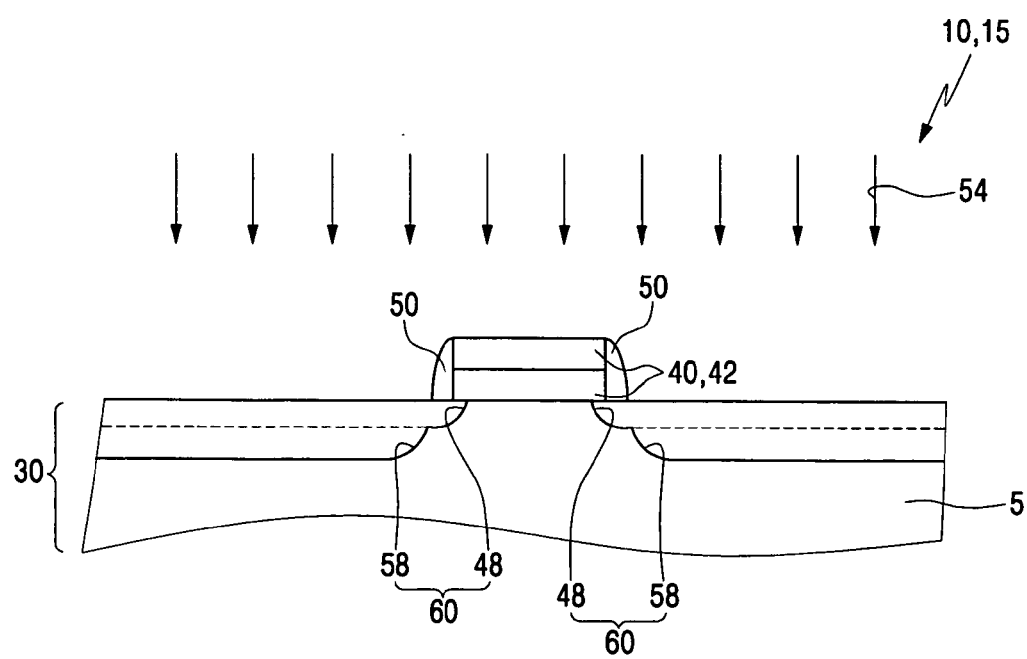

Referring to FIGS. 1, 6, and 7, a semiconductor substrate 5 having a cell array region 10 and a peripheral circuit region 15 is prepared. A lower cell gate pattern 40 is formed on the semiconductor substrate 5 of at least one reference active region 30 in the cell array region 10. A lower peripheral gate pattern 42 may be formed on the semiconductor substrate 5 of at least one reference active region 30 in the peripheral region 15, simultaneously with the formation of the lower cell gate pattern 40 in the cell array region 10. Each of the lower cell and peripheral gate patterns 40 and 42 has a gate 34 and a gate capping layer pattern 38 stacked thereon. It is preferable that the gate 134 include an $N^+$-type polysilicon layer and a metal silicide layer stacked thereon. The gate 34 may include only the $N^+$-type polysilicon layer. It is preferable that the gate capping layer pattern 38 include silicon nitride ($Si_3N_4$). It is preferable that the semiconductor substrate 5 be formed of a P-type conductivity type.

An ion implantation process 44 is performed in the semiconductor substrate 5 using the lower cell and peripheral gate patterns 40 and 42 in the cell array region 10 and the peripheral circuit region 15 as a mask. The ion injection process 44 forms $N^-$type conductive regions 48 in the semiconductor substrate 5. The $N^-$type conductive regions 48 overlap the lower cell and peripheral gate patterns 40 and 42. Lower gate spacers 50 are formed on sidewalls of the lower cell and peripheral gate patterns 40 and 42. It is preferable that the lower gate spacers 50 include an insulating layer having the same etching rate as the gate capping layer pattern 38. It is preferable that a portion between the $N^-$type conductive regions 48 of the semiconductor substrate 5 is doped with channel impurity ions before forming the lower cell and peripheral gate patterns 40 and 42.

An ion implantion process 54 is performed in the semiconductor substrate 5 using the gate spacers 50 and the lower cell and peripheral gate patterns 40 and 42 in the cell array region 10 and the peripheral circuit region 15 as a mask. The ion implantation process 54 forms an $N^+$-type conductive regions 58 in the semiconductor substrate 5. The $N^+$-type conductive regions 58 overlap the lower cell and peripheral gate patterns 40 and 42. The $N^-$type and $N^+$-type conductive regions 48 and 58 form impurity regions 60 in the cell array region 10 and the peripheral circuit region 15.

Figure 8:
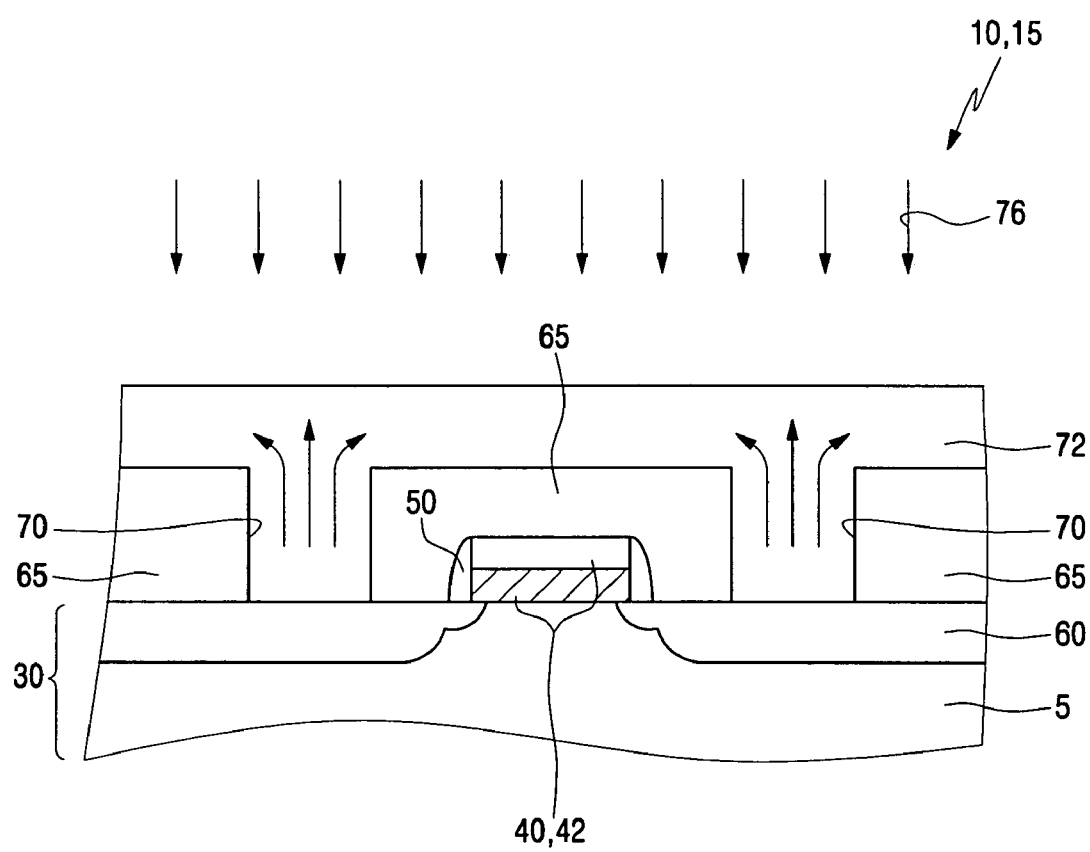
Figure 9:
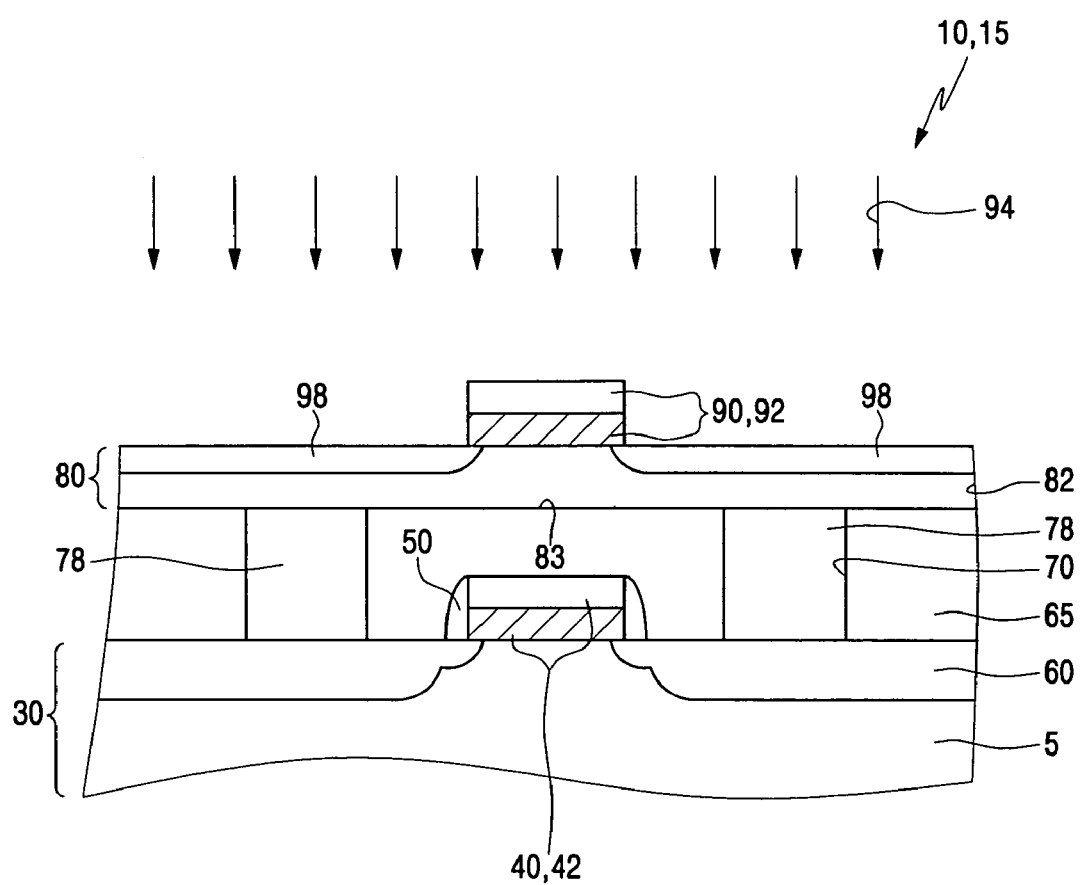

Referring to FIGS. 1, 8, and 9, a pad interlayer insulating layer 65 is formed on the semiconductor substrate 5 to cover the lower cell and peripheral gate patterns 40 and 42 in the cell array region 10 and the peripheral circuit region 15. Seed openings 70 are formed in the pad interlayer insulating layer 65 to expose the impurity regions 60. A semiconductor layer 72 is formed on the pad interlayer insulating layer 65 to fill the seed openings 70. It is preferable that the semiconductor layer 72 be formed of single crystal silicon using a selective epitaxial growth (SEG) technique.

A planarization process 76 is performed on the semiconductor layer 72 to expose the pad interlayer insulating layer 65. The planarization process 76 forms the semiconductor layer patterns 78 in the seed openings 70. Other semiconductor layer 82 is formed on the pad interlayer insulating layer 65 to cover the semiconductor layer pattern 78. It is preferable that the other semiconductor layer 82 be formed of amorphous silicon. The other semiconductor layer 82 may be formed using a chemical vapor deposition (CVD) technique or a plasma-enhanced chemical vapor deposition (PECVD) technique. The other semiconductor layer 82 is subjected to a semiconductor heating process (not shown). The semiconductor heating process crystallizes the other semiconductor layer 82 using the semiconductor layer pattern 78 as a seed. Also, the other semiconductor layer 82 and the semiconductor layer patterns 78 may be simultaneously formed by performing selective epitaxial growth technique using the semiconductor layer 72 of FIG. 8. In addition, if the surface state of the semiconductor layer 72 is not good, the planarization process 76 may be performed for partially removing the semiconductor layer 72. At this time, the semiconductor layer 72 fills the seed openings 70 and covers the pad interlayer insulating layer 65. Thereby, the manufacturing process can be simplified.

A photolithography and etching processes (not shown) are performed on the other semiconductor layer 82 to form other semiconductor substrates 83 in the cell array region 10 and the peripheral circuit region 15. The other semiconductor substrates 83 define other active regions 80, respectively. It is preferable that the other active region 80 be formed in parallel with the reference active region 30 in the cell array region 10 and the peripheral circuit region 15. It is preferable that the other active region 80 be formed to have the same width as the reference active region 30. The other active region 80 may have a width different from that of the reference active region 30.

Upper cell and peripheral gate patterns 90 and 92 are formed on the other semiconductor substrates 83 of the other active regions 80 in the cell array region 10 and the peripheral circuit region 15, respectively. It is preferable that the upper cell and peripheral gate patterns 90 and 92 be formed of the same structure as the lower cell and peripheral gate patterns 40 and 42. An ion implantation process 94 is performed in the other semiconductor substrate 83 using the upper cell and peripheral gate patterns 90 and 92 as a mask. The ion implantation process 94 forms $N^-$type conductive regions 98 in the other semiconductor substrates 83 of the other active regions 80, respectively. It is preferable that a portion between the $N^-$type conductive regions 98 of the other semiconductor substrate 83 be doped with channel impurity ions before forming the upper cell and peripheral gate patterns 90 and 92.

Figure 10:
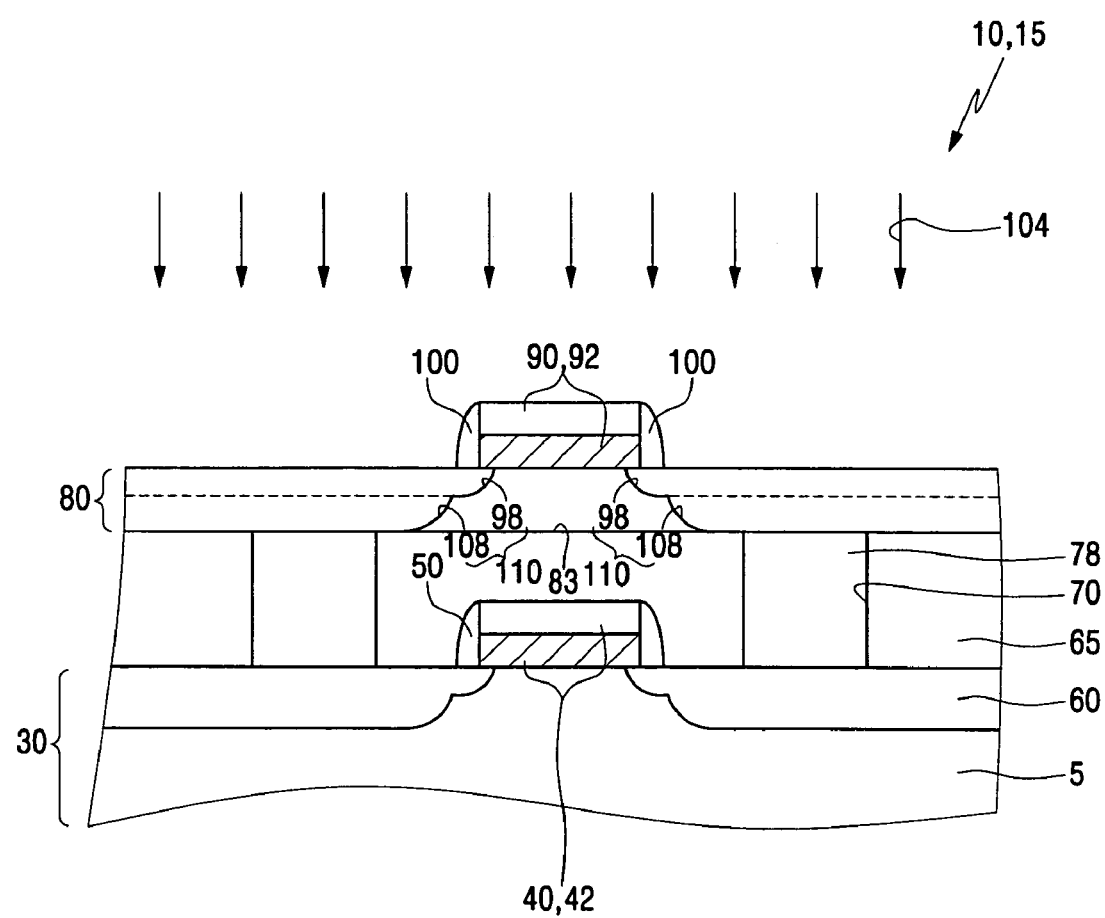
Figure 11:
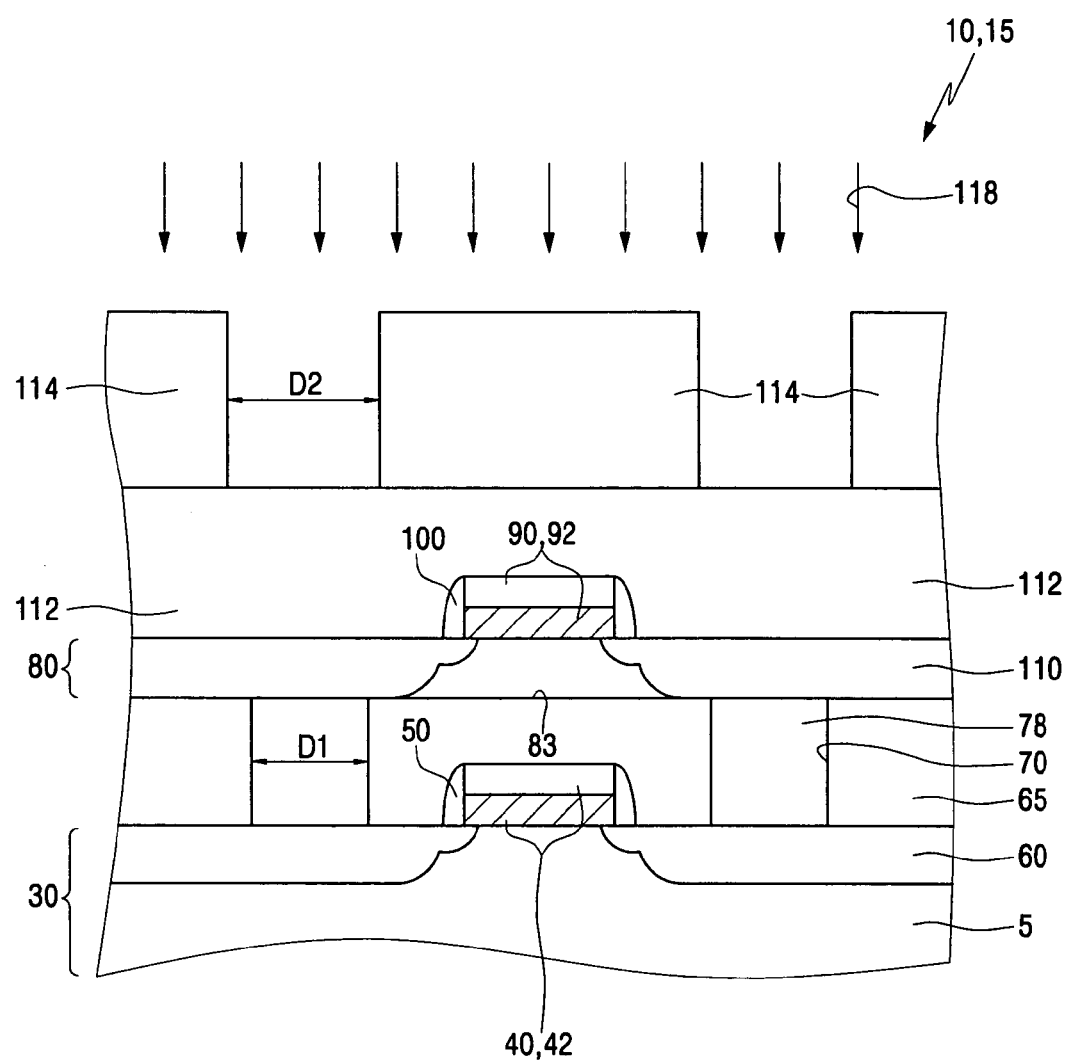

Referring to FIGS. 1, 10, and 11, upper gate spacers 100 are formed on sidewalls of the upper cell and peripheral gate patterns 90 and 92. An ion implantation process 104 is performed in the other semiconductor substrates 83 of the other active regions 80 together with the gate spacers 100 using the upper cell and peripheral gate patterns 90 and 92 as a mask. The ion implantation process 104 forms $N^+$-type conductive regions 108 in the other semiconductor substrates 83 of the other active regions 80 of the cell array region 10 and the peripheral circuit region 15. Accordingly, the $N^-$type and $N^+$-type conductive regions 98 and 108 form an impurity regions 110 in the cell array region 10 and the peripheral circuit region 15. Also, the ion implantation process 104 can be separately performed so that the $N^+$-type conductive regions 108 are formed in the cell array region 10 and $P^+$-type conductive regions are formed in the peripheral circuit region 15. It is preferable that the $N^+$-type conductive regions 108 and the $P^+$-type conductive region overlap the upper cell and peripheral gate patterns 90 and 92, respectively. Thereby, the impurity region 110 is formed by the $N^-$-type and $N^+$-type conductive regions 98 and 108 in the cell array region. In addition, the other impurity region 110 is formed by the N⁻type conductive regions 98 and the P⁺-type conductive region in the peripheral circuit region.

A pad interlayer insulating layer 112 is formed on the other semiconductor substrates 83 of the other active regions 80 to cover the upper cell and peripheral gate patterns 90 and 92. According to FIGS. 6 to 11, at least two other active regions 80 may be formed vertically in sequence on the pad interlayer insulating layer 65 surrounding the semiconductor layer pattern 78 in the cell array region 10 and the peripheral circuit region 15. In this case, the other active regions 80 can be defined by using the other semiconductor substrates 83, respectively. The upper cell and peripheral gate patterns 90 and 92 are formed in sequence on the other semiconductor substrates 83 of the other active regions 80 above the reference active region 30, respectively. Pad interlayer insulating layers 112 are respectively formed on the other semiconductor substrates 83 to cover the upper cell and peripheral gate patterns 90 and 92. As a result, the PRAM 20 of FIG. 1 has a given design rule to increase integration of the gate patterns in the cell array region 10 and the peripheral circuit region 15.

Photoresist patterns 114 are formed on the pad interlayer insulating layer 112, which is located on an uppermost surface from the reference active region 30 in the cell array region 10 and the peripheral circuit region 15 to cover the other active region 80. It is preferable that the photoresist patterns 114 have a hole shape. It is preferable that diameter D2 of the hole of the photoresist pattern 14 be formed greater than diameter D1 of the seed opening 70. It is preferable that the photoresist patterns 114 be aligned with the cell gate patterns 40 and 90 and the peripheral gate patterns 42 and 92 together with the seed openings 70. An etching process 118 is performed on the pad interlayer insulating layers 112 and 65 and the other semiconductor substrate 83 using the photoresist patterns 114 as an etching mask. An etching process 118 may be performed on the pad interlayer insulating layers 112 and 65 and the other semiconductor substrates 83 using the photoresist patterns 114 as an etching mask.

Figure 12:
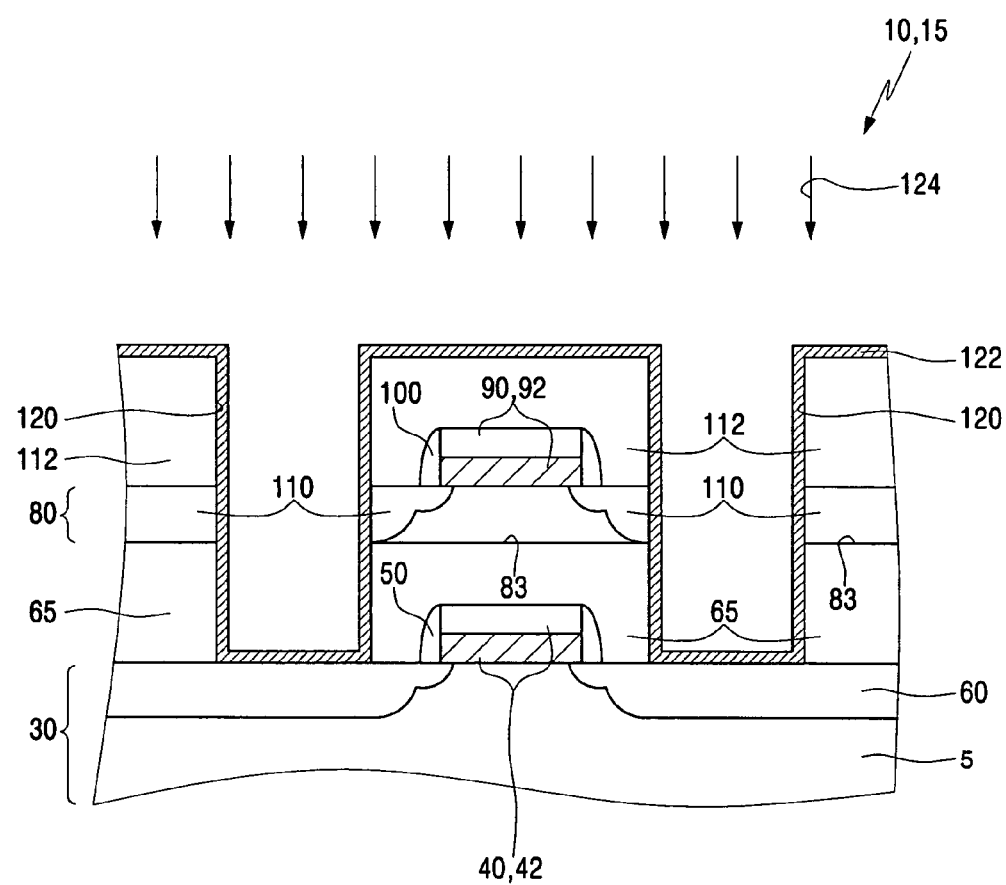
Figure 13:
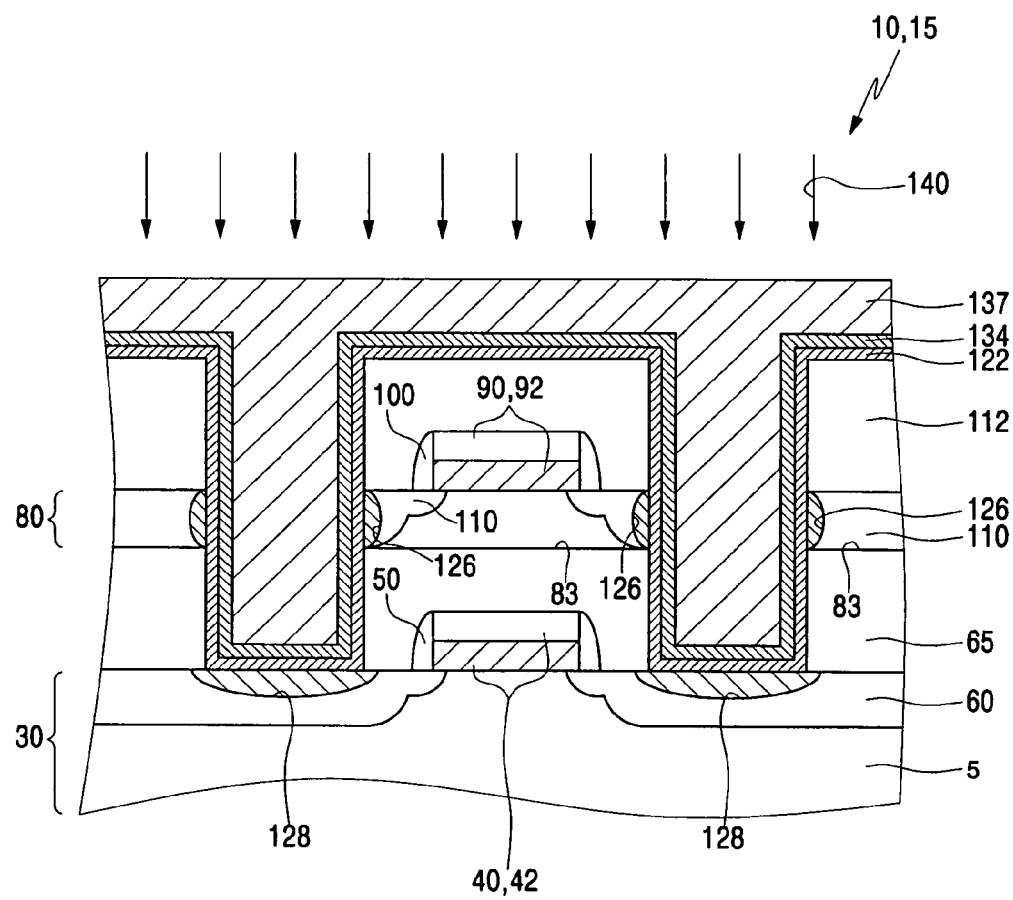
Figure 14:
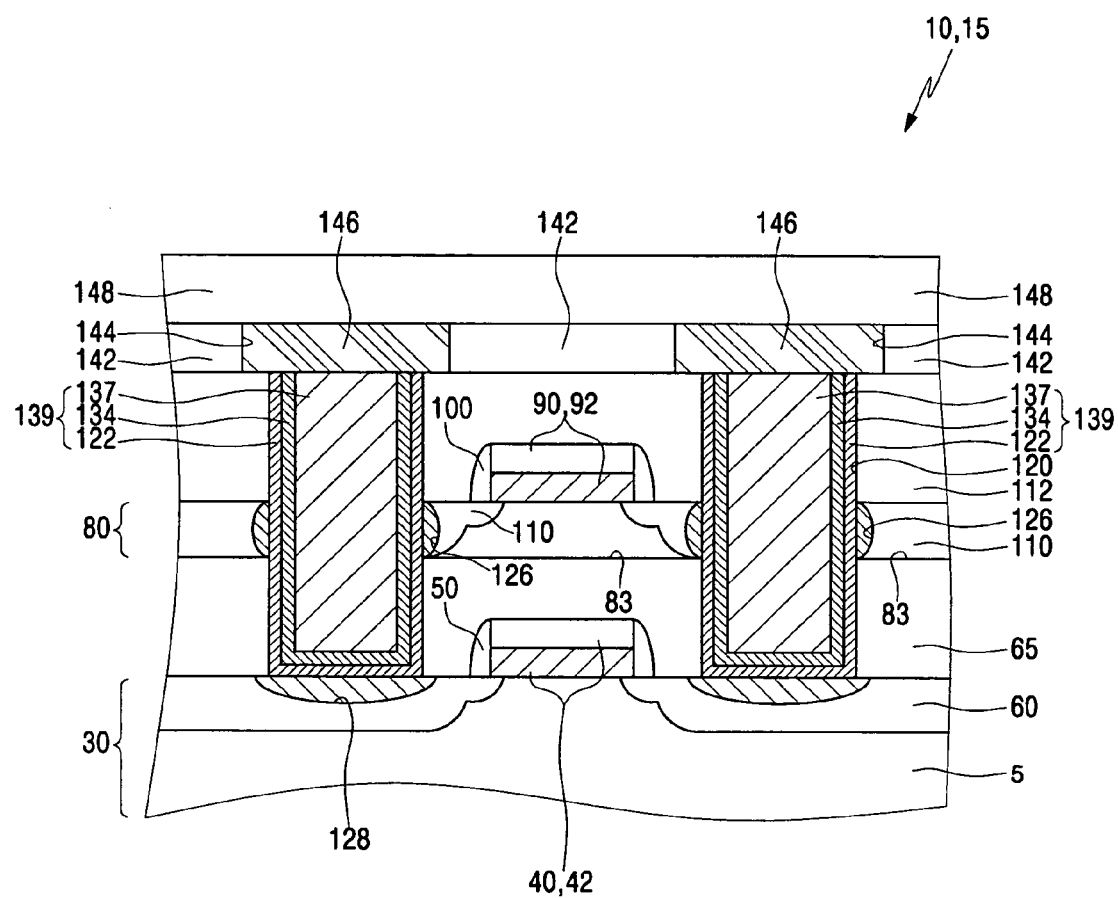
Figure 15:
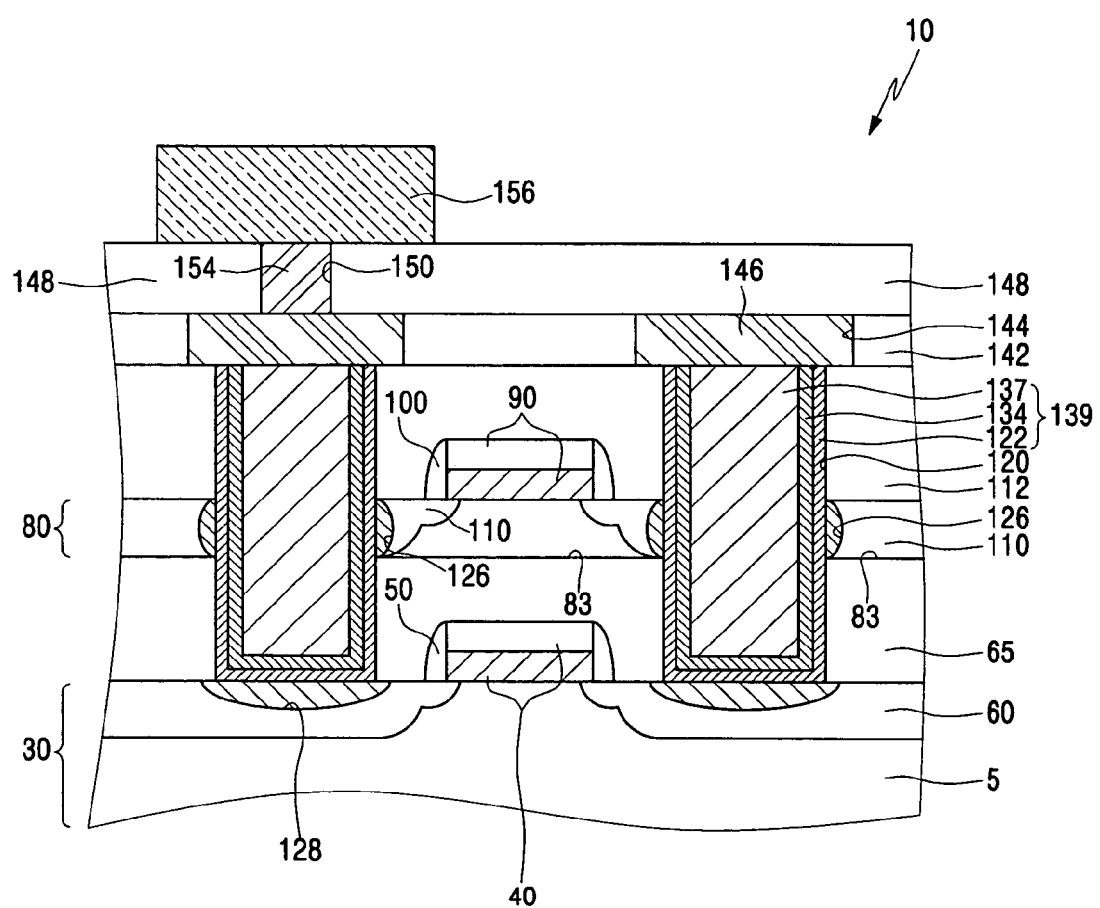
Figure 16:
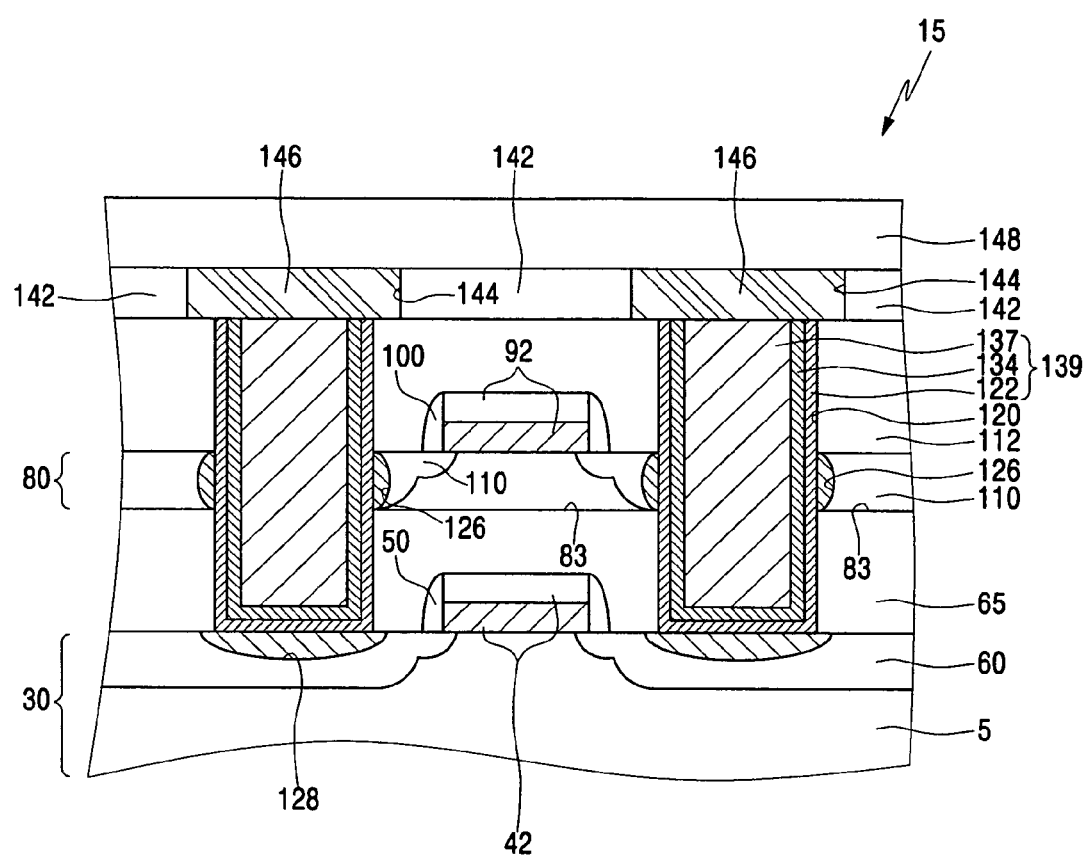

Referring to FIGS. 1, 12, and 13, the etching process 118 forms plug holes 120 in the pad interlayer insulating layers 112 and 65 and the other semiconductor substrate 83 in the cell array region 10 and the peripheral circuit region 15 to expose the semiconductor substrate 5. The etching process may form plug holes 120 in the pad interlayer insulating layers 112 and 65 and the other semiconductor substrates 83 in the cell array region 10 and the peripheral circuit region 15 to expose the semiconductor substrate 5. It is preferable that the plug holes 120 be located at both sides of the upper and lower cell gate patterns 40 and 90, and the upper and peripheral gate patterns 42 and 92 to expose the impurity regions 60 of the semiconductor substrate 5.

A cobalt layer 122 is formed on the pad interlayer insulating layer 112 to conformally cover the plug holes 120. The semiconductor substrate having the cobalt layer 122 is subjected to a semiconductor heating process 124. By performing the semiconductor heating process 124, the cobalt layer 122 is reacted with the semiconductor substrate 5 and the other semiconductor substrate 83 to form cobalt silicide layers 126 below the plug holes 120 and at predetermined regions of sidewalls of the plug holes 120. By performing the semiconductor heating process 124, the cobalt layer 122 may be reacted with the semiconductor substrate 5 and the other semiconductor substrates 83 to form cobalt silicide layers 126 at predetermined regions of sidewalls of the plug holes 120 and cobalt silicide layers 128 under the plug holes 120.

A barrier layer 134 and a tungsten layer 137 are formed on the cobalt layer 122 in sequence to fill the plug holes 120. A planarization process 140 is performed on the tungsten layer 137, the barrier layer 134, and the cobalt layer 122 to expose the pad interlayer insulating layer 112. The planarization process 140 can be performed using a chemical mechanical polishing technique or etch-back technique. It is preferable that the barrier layer 134 include titanium (Ti) and titanium nitride (TiN) stacked thereon.

Referring to FIGS. 1, 14 to 16, the planarization process 140 forms metal node plugs 139 respectively in the plug holes 120 of the cell array region 10 and the peripheral circuit region 15. The metal node plugs 139 are in contact with the semiconductor substrate 5 penetrating the pad interlayer insulating layer 112 and the other semiconductor substrates 83. The lower and upper cell gate patterns 40 and 90 in the cell array region 10 and the lower and upper peripheral gate patterns 42 and 92 in the peripheral circuit region 15 can maximize current driving capability using the metal node plugs 139 while operating the PRAM 20 of FIG. 1. The metal node plugs 139 can minimize the loss of the current flowing through the lower and upper cell gate patterns 40 and 90 and the lower and upper peripheral gate patterns 42 and 92. This is because the metal node plugs 139 are formed to have a deterrent against contacting the impurity regions 60 and 110 through the semiconductor substrate 5 and the other semiconductor substrates 83. Accordingly, the metal node plugs 139 may have a resistance smaller than that of the first and second seed windows of the prior art (U.S. Pat. No. 6,429,484). Further, the cobalt silicide layers 126 in the predetermined regions of the sidewalls of the plug holes 120 reduce loss of the current.

A buried interlayer insulating layer 142 is formed on the pad interlayer insulating layer 112 in the cell array region 10 and the peripheral circuit region 15 to cover the metal node plugs 139. Buried contact holes 144 are formed in the buried interlayer insulating layer 142 to expose the metal node plugs 139, respectively. Buried plugs 146 are formed to fill the buried contact holes 144. The buried plugs 146 can be classified into a landing pad and a lower wire. The landing pad is in contact with one of the metal node plugs 139. The lower wire is in contact with the remaining metal node plugs 139. It is preferable that the buried interlayer insulating layer 142 be formed of an insulating layer having the same etching rate as the pad interlayer insulating layer 112. The buried interlayer insulating layer 142 may be an insulating layer having the etching rate different from that of the pad interlayer insulating layer 112. It is preferable that the buried plug 146 include an aluminum (Al) layer. A planarization interlayer insulating layer 148 is formed on the buried interlayer insulating layer 142 in the cell array region 10 and the peripheral circuit region 15 to cover the buried plugs 146.

A node contact hole 150 is formed in the planarization interlayer insulating layer 148 to cover one (the landing pad) of the buried plugs 146 in the cell array region 10. A node plug 154 is formed to fill the node contact hole 150. It is preferable that the node plug 154 include a metal nitride layer containing a titanium nitride layer. A phase change layer pattern 156 is formed on the planarization interlayer insulating layer 148 to be in contact with the node plug 154. It is preferable that the phase change layer pattern 156 be formed of Chalcogenide containing a combination ($Ge_XSb_YTe_Z$) of germanium, antimony, and tellurium. It is preferable that the planarization interlayer insulating layer 148 be formed of an insulating layer having the same etching rate as the buried interlayer insulating layer 142.

Figure 17:
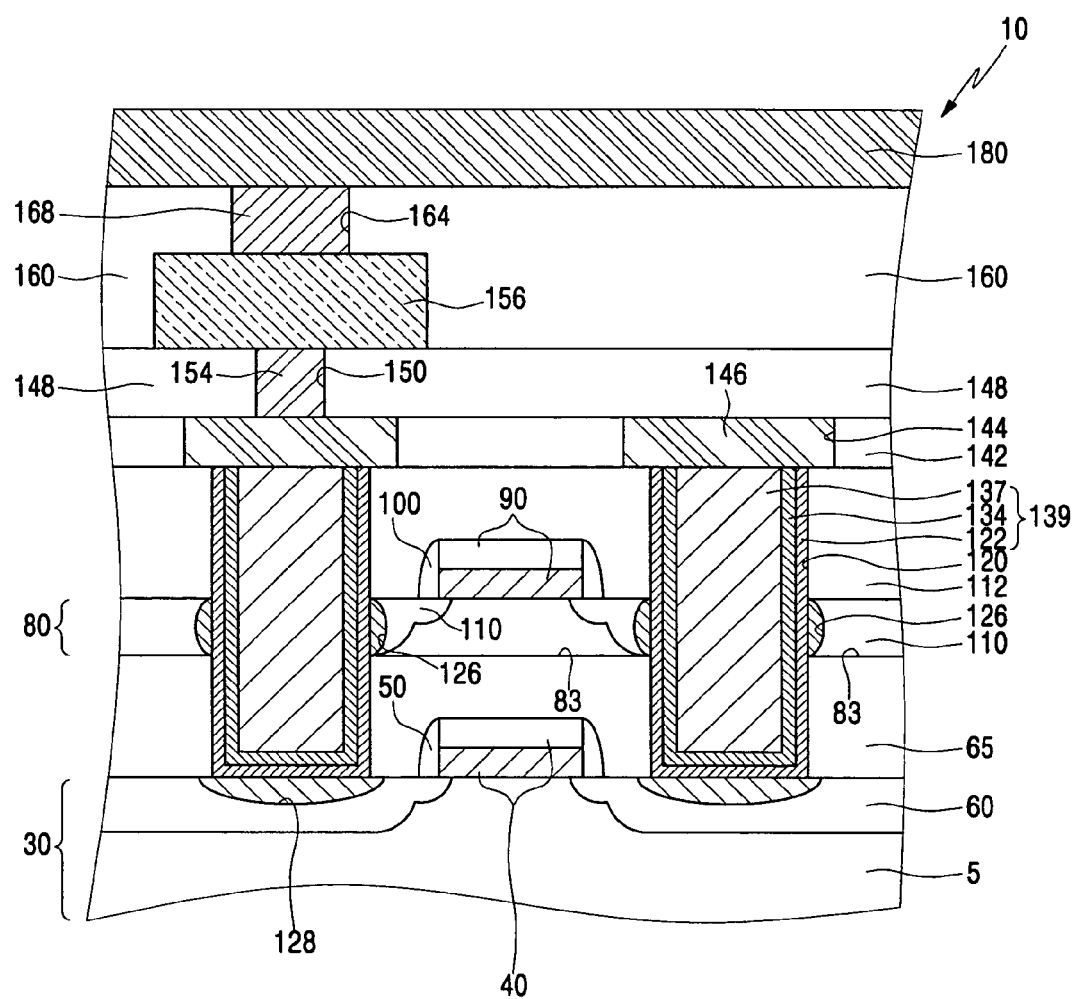
Figure 18:
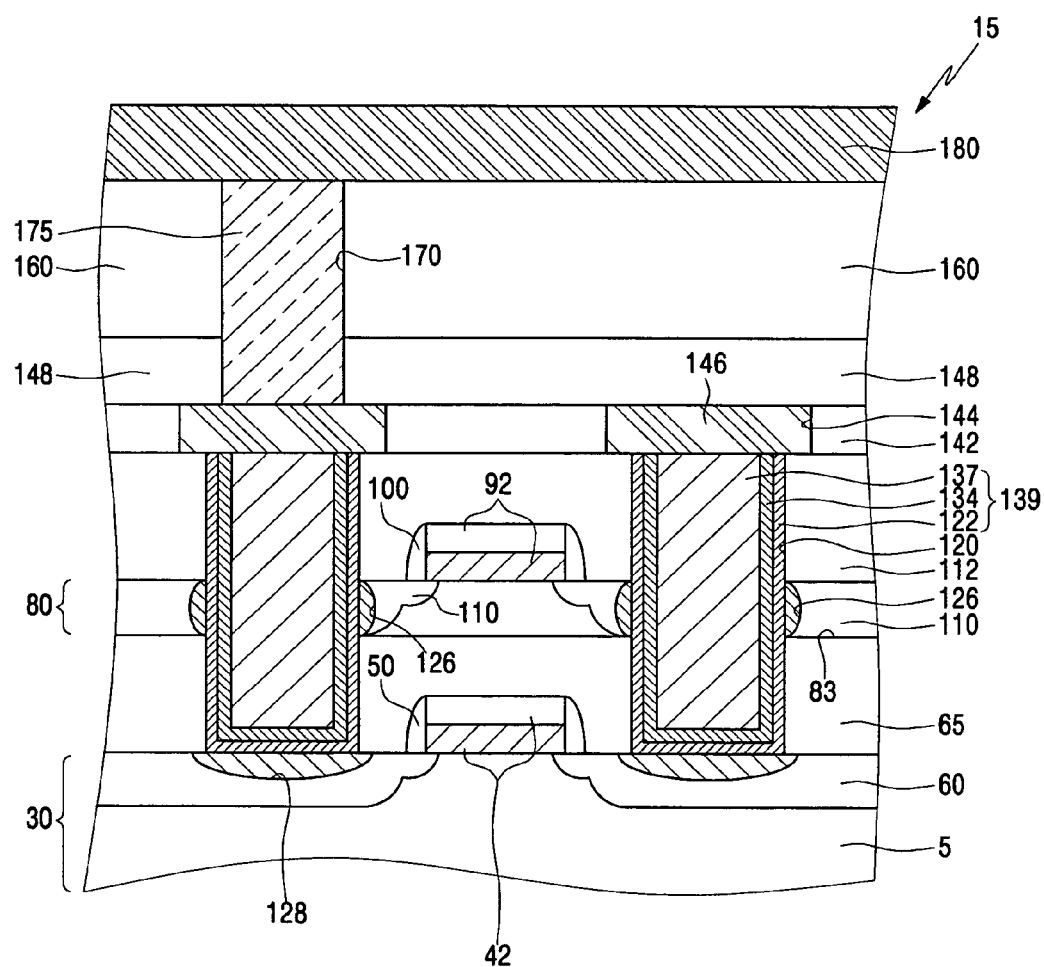

Referring to FIGS. 1, 17, and 18, a protective interlayer insulating layer 160 is formed on the planarization interlayer insulating layer 148 to cover the phase change layer pattern 156 in the cell array region 10 and the peripheral circuit region 15. It is preferable that the protective interlayer insulating layer 160 be formed of an insulating layer having the same etching rate as the planarization interlayer insulating layer 148. A contact hole 164 is formed in a predetermined region of the protective interlayer insulating layer 160 to expose the phase change layer pattern 156. A contact plug 168 is formed to fill the contact hole 164. It is preferable that the contact plug 168 include a metal nitride layer containing a titanium nitride layer. A circuit wire 180 is formed on the protective insulating layer 160 to be in contact with the contact plug 168.

A landing hole 170 is formed in the protective interlayer insulating layer 160 and the planarization interlayer insulating layer 148 to expose one (the landing pad) of the buried plugs 146 in the peripheral circuit region 15. A landing plug 175 is formed to fill the landing hole 170. The circuit wire 180 is formed on the protective interlayer insulating layer 160 to be in contact with the landing plug 175. The circuit wire 180 may be referred to as an upper wire in the cell array region 10 and the peripheral circuit region 15. It is preferable that the circuit wire 180 include an aluminum layer.

As described above, the invention provides an approach to increasing integration of the cell and peripheral transistors in the cell array region and the peripheral circuit region with a given design rule. As a result, the phase change layer pattern in the cell array region can rapidly undergo phase change and the driving capability of the transistors in the peripheral circuit region can be maximized to improve design performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase-change random access memory (PRAM) having a phase change layer pattern in a cell array region, comprising:
   a first semiconductor substrate defining at least one reference active region;
   at least one other semiconductor substrate located in sequence on a vertical line passing a main surface of the reference active region, defining at least one other active region, respectively, and being in parallel with the first semiconductor substrate;
   a lower cell gate pattern located on the first semiconductor substrate of the reference active region and an upper cell gate pattern located on the other active region of the other semiconductor substrate; and
   metal node plugs located at both sides of the lower and upper cell gate patterns and being in contact with the first semiconductor substrate penetrating the other semiconductor substrate and being in contact with the other active region,
   wherein one of the metal node plugs is located below the phase change layer pattern and is electrically connected to the phase change layer pattern.

2. The PRAM according to claim 1, wherein the phase change layer pattern comprises Chalcogenide containing a combination ($Ge_xSb_yTe_z$) of germanium, antimony, and tellurium.

3. The PRAM according to claim 1, wherein the metal node plugs comprise a cobalt layer, a barrier layer, and a tungsten layer stacked in sequence, and the barrier layer comprises titanium (Ti) and titanium nitride (TiN) stacked thereon.

4. The PRAM according to claim 1, wherein the first semiconductor substrate and the other semiconductor substrate comprise single crystal silicon and crystal silicon, respectively.

5. The PRAM according to claim 1, further comprising:
   pad interlayer insulating layers located on the first semiconductor substrate and the other semiconductor substrate and covering the lower and upper cell gate patterns, respectively; and
   impurity regions located on the first semiconductor substrate and the other semiconductor substrate and overlapping the lower and upper cell gate patterns, respectively,
   wherein the impurity regions have a conductivity type different from that of the first semiconductor substrate and are in contact with the metal node plugs, respectively.

6. A phase-change random access memory (PRAM) having a phase change layer pattern in a cell array region, comprising:
   a first semiconductor substrate defining at least one reference active region;
   at least one other semiconductor substrate located in sequence on a vertical line passing a main surface of the reference active region, defining at least one other active region, respectively, and being in parallel with the first semiconductor substrate;
   a lower cell gate pattern located on the first semiconductor substrate of the reference active region and an upper cell gate pattern located on the other active region of the other semiconductor substrate; and
   metal node plugs located at both sides of the lower and upper cell gate patterns and being in contact with the first semiconductor substrate penetrating the other semiconductor substrate,
   wherein one of the metal node plugs is located below the phase change layer pattern and is electrically connected to the phase change layer pattern, and
   wherein the first semiconductor substrate and the other semiconductor substrate further comprise cobalt suicide layers at portions that are in contact with the metal node plugs.

7. A phase-change random access memory (PRAM) having a phase change layer pattern in a cell array region, comprising:
   a first semiconductor substrate defining at least one reference active region:
   at least one other semiconductor substrate located in sequence on a vertical line passing a main surface of the reference active region, defining at least one other active region, respectively, and being in parallel with the first semiconductor substrate;
   a lower cell gate pattern located on the first semiconductor substrate of the reference active region and an upper cell gate pattern located on the other active region of the other semiconductor substrate;
   metal node plugs located at both sides of the lower and upper cell gate patterns and being in contact with the first semiconductor substrate penetrating the other semiconductor substrate;

buried plugs and a node plug contacting one of the buried plugs stacked in sequence between the metal node plugs and the phase change layer pattern; and a buried interlayer insulating layer and a planarization interlayer insulating layer surrounding the buried plugs and the node plug, respectively, wherein one of the metal node plugs is located below the phase change layer pattern and is electrically connected to the phase change layer pattern, and wherein the node plug is in contact with the phase change layer pattern and the buried plugs are in contact with the metal node plugs.

8. A phase-change random access memory (PRAM) having a circuit wire in a peripheral circuit region, comprising:

a first semiconductor substrate defining at least one reference active region;

at least one other semiconductor substrate located in sequence on a vertical line passing a main surface of the reference active region, defining at least one other active region, respectively, and being in parallel with the first semiconductor substrate;

a lower peripheral gate pattern located on the first semiconductor substrate of the reference active region and an upper peripheral gate pattern located on the other active regions active region of the other semiconductor substrate; and metal node plugs located at both sides of the lower and upper peripheral gate patterns and being in contact with the first semiconductor substrate penetrating the other semiconductor substrate and being in contact with the other active region, wherein one of the metal node plugs is located below the circuit wire and is electrically connected to the circuit wire.

9. The PRAM according to claim 8, wherein the metal node plugs comprise a cobalt layer, a barrier layer, and a tungsten layer stacked in sequence, and the barrier layer comprises titanium and titanium nitride stacked thereon.

10. The PRAM according to claim 8, wherein the first semiconductor substrate and the other semiconductor substrate comprise single crystal silicon and crystal silicon, respectively.

11. The PRAM according to claim 8, further comprising:

pad interlayer insulating layers located on the first semiconductor substrate and the other semiconductor substrate and covering the lower and upper peripheral gate patterns; and impurity regions located on the first semiconductor substrate and the other semiconductor substrate and overlapping the lower and upper peripheral gate patterns, wherein the impurity regions have a conductivity type different from that of the first semiconductor substrate and are in contact with the metal node plugs.

12. The PRAM according to claim 8, further comprising:

pad interlayer insulating layers located on the first semiconductor substrate and the other semiconductor substrate and covering the lower and upper peripheral gate patterns; and impurity regions located on the first semiconductor substrate and the other semiconductor substrate and overlapping the lower and upper peripheral gate patterns, wherein the impurity regions have the same conductivity type as the first semiconductor substrate and are in contact with the metal node plugs.

13. A phase-change random access memory (PRAM) having a circuit wire in a peripheral circuit region, comprising:

a first semiconductor substrate defining at least one reference active region;

at least one other semiconductor substrate located in sequence on a vertical line passing a main surface of the reference active region, defining at least one other active region, respectively, and being in parallel with the first semiconductor substrate;

a lower peripheral gate pattern located on the first semiconductor substrate of the reference active region and an upper peripheral gate pattern located on the other active region of the other semiconductor substrate; and metal node plugs located at both sides of the lower and upper peripheral gate patterns and being in contact with the first semiconductor substrate penetrating the other semiconductor substrate, wherein one of the metal node plugs is located below the circuit wire and is electrically connected to the circuit wire, and wherein the first semiconductor substrate and the other semiconductor substrate further comprise cobalt silicide layers at portions that are in contact with the metal node plugs.

14. A phase-change random access memory (PRAM) having a circuit wire in a peripheral circuit region, comprising:

a first semiconductor substrate defining at least one reference active region;

at least one other semiconductor substrate located in sequence on a vertical line passing a main surface of the reference active region, defining at least one other active region, respectively, and being in parallel with the first semiconductor substrate;

a lower peripheral gate pattern located on the first semiconductor substrate of the reference active region and an upper peripheral gate pattern located on the other active region of the other semiconductor substrate;

metal node plugs located at both sides of the lower and upper peripheral gate patterns and being in contact with the first semiconductor substrate penetrating the other semiconductor substrate;

buried plugs and a landing plug contacting one of the buried plugs and stacked in sequence between the metal node plugs and the circuit wire; and a buried interlayer insulating layer surrounding the buried plugs, and a planarization interlayer insulating layer and a protective interlayer insulating layer surrounding the landing plug, wherein one of the metal node plugs is located below the circuit wire and is electrically connected to the circuit wire, and wherein the landing plug is in contact with the circuit wire, and the buried plugs are in contact with the metal node plugs.

* * * * *

UNITED STATES PATENT AND TRADEMARK OFFICE
CERTIFICATE OF CORRECTION

PATENT NO. : 7,309,885 B2  Page 1 of 1
APPLICATION NO. : 11/246863
DATED : December 18, 2007
INVENTOR(S) : Jae-Hyun Park et al.

It is certified that error appears in the above-identified patent and that said Letters Patent is hereby corrected as shown below:

Column 12, lines 46 and 47 delete "suicide" and insert --silicide--

Signed and Sealed this

Sixteenth Day of December, 2008

JON W. DUDAS
*Director of the United States Patent and Trademark Office*